United States Patent
Colvin et al.

(10) Patent No.: US 11,276,543 B2
(45) Date of Patent: *Mar. 15, 2022

(54) HYDROGEN GENERATOR FOR AN ION IMPLANTER

(71) Applicant: Axcelis Technologies, Inc., Beverly, MA (US)

(72) Inventors: Neil K Colvin, Merrimack, NH (US); Tseh-Jen Hsieh, Rowley, MA (US); Richard Rzeszut, Billerica, MA (US); Wendy Colby, Newburyport, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/953,509

(22) Filed: Nov. 20, 2020

(65) Prior Publication Data

US 2021/0090841 A1  Mar. 25, 2021

Related U.S. Application Data

(63) Continuation of application No. 16/252,884, filed on Jan. 21, 2019, now Pat. No. 10,847,339.

(Continued)

(51) Int. Cl.
*H01J 37/08* (2006.01)
*H01J 37/317* (2006.01)
*H01L 21/265* (2006.01)

(52) U.S. Cl.
CPC .......... *H01J 37/08* (2013.01); *H01J 37/3171* (2013.01); *H01J 2237/006* (2013.01);

(Continued)

(58) Field of Classification Search
USPC ...................................... 250/492.3
See application file for complete search history.

(56) References Cited

U.S. PATENT DOCUMENTS 4,942,304 A * 7/1990 Boston .................... C23C 14/48
                                                         250/423 R
5,563,418 A * 10/1996 Leung ................ H01J 37/3007
                                                         250/492.21

(Continued)

FOREIGN PATENT DOCUMENTS

FR     2926301 A1   7/2009
JP    H07245196 A   9/1995
JP   2004039475 A   2/2004

OTHER PUBLICATIONS

International Search Report and Written Opinion dated Apr. 29, 2019 in connection with International Application No. PCT/US2019/014474.

(Continued)

*Primary Examiner* — Phillip A Johnston
(74) *Attorney, Agent, or Firm* — Eschewiler & Potnashnik, LLC

(57) ABSTRACT

A terminal for an ion implantation system is provided, wherein the terminal has a terminal housing for supporting an ion source configured to form an ion beam. A gas box within the terminal housing has a hydrogen generator configured to produce hydrogen gas for the ion source. The gas box is electrically insulated from the terminal housing, and is further electrically coupled to the ion source. The ion source and gas box are electrically isolated from the terminal housing by a plurality of electrical insulators. A plurality of insulating standoffs electrically isolate the terminal housing from an earth ground. A terminal power supply electrically biases the terminal housing to a terminal potential with respect to the earth ground. An ion source power supply electrically biases the ion source to an ion source potential with respect to the terminal potential. Electrically conductive tubing electrically couples the gas box and ion source.

20 Claims, 3 Drawing Sheets

Related U.S. Application Data

(60) Provisional application No. 62/620,144, filed on Jan. 22, 2018.

(52) U.S. Cl.
CPC . *H01J 2237/022* (2013.01); *H01J 2237/0213* (2013.01); *H01J 2237/0807* (2013.01); *H01L 21/265* (2013.01)

(56) References Cited

U.S. PATENT DOCUMENTS

| | | | |
|---|---|---|---|
| 6,797,968 B2 * | 9/2004 | Tsukihara | H01J 37/3007 250/396 ML |
| 7,629,590 B2 | 12/2009 | Horsky | |
| 7,675,046 B2 | 3/2010 | Tekletsadik | |
| 8,000,080 B2 | 8/2011 | Krause et al. | |
| 8,101,488 B1 | 1/2012 | Smick | |
| 8,143,604 B2 | 3/2012 | Low | |
| 10,847,339 B2 * | 11/2020 | Colvin | H01J 37/08 |
| 2007/0235663 A1 | 10/2007 | Low et al. | |

OTHER PUBLICATIONS

T. Adams, "Point-of-use Arsine Generation May Foreshadow Future Methods", Solid State Technology, Jun. 1995, p. 117-118.

Non-Final Office Action dated Feb. 18, 2020 in connection with U.S. Appl. No. 16/252,884.

Notice of Allowance dated Jul. 27, 2020 in connection with U.S. Appl. No. 16/252,884.

\* cited by examiner

HYDROGEN GENERATOR FOR AN ION IMPLANTER

REFERENCE TO RELATED APPLICATIONS

This application is a Continuation Application which claims the benefit of U.S. Non-Provisional application Ser. No. 16/252,884 filed Jan. 21, 2019, entitled "HYDROGEN GENERATOR FOR AN ION IMPLANTER", which further claims the benefit of U.S. Provisional Application Ser. No. 62/620,144 filed Jan. 22, 2018, the contents of all of which are herein incorporated by reference in their entirety.

TECHNICAL FIELD

The present invention relates generally to ion implantation systems, and more specifically to an ion implantation system having a hydrogen generator for an ion source of the ion implantation system.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energize and direct the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

Ion sources in ion implanters typically generate the ion beam by ionizing a source material in an arc chamber, wherein a component of the source material is a desired dopant element. The desired dopant element is then extracted from the ionized source material in the form of the ion beam. In some instances, the desired dopant element may comprise ions of a metal, such as aluminum.

Conventionally, when aluminum ions are the desired dopant element, materials such as aluminum nitride (AlN) and alumina ($Al_2O_3$) have been used as a source material of aluminum ions for the purpose of ion implantation. Aluminum nitride or alumina are solid, insulative materials which are typically placed in the arc chamber where the plasma is formed (in the ion source). An etchant gas (e.g., a gas containing fluorine) is conventionally introduced to chemically etch the aluminum-containing materials, whereby the source material is ionized, and aluminum is extracted and transferred along the beamline to silicon carbide workpiece positioned in an end station for implantation thereto. The etching process, however, produces insulating material (e.g., $AlF_x$, AlN, $Al_2O_3$, etc.) which is emitted along with the intended aluminum ions from the arc chamber, whereby the insulating material can cause deleterious arcing between various components of the ion implantation system.

SUMMARY

The following presents a simplified summary of the disclosure in order to provide a basic understanding of some aspects of the disclosure. This summary is not an extensive overview of the disclosure. It is intended to neither identify key or critical elements of the invention nor delineate the scope of the invention. Its purpose is to present some concepts of the disclosure in a simplified form as a prelude to the more detailed description that is presented later.

Aspects of the disclosure facilitate ion implantation processes for implanting aluminum ions into a workpiece. According to one exemplary aspect, an ion implantation system is provided having an ion source configured to form an ion beam, a beamline assembly configured to selectively transport the ion beam, and an end station is configured to accept the ion beam for implantation of the aluminum ions into a workpiece.

In accordance with one exemplary aspect, a terminal system for an ion implantation system is provided. The terminal system, for example, comprises a terminal housing, and an ion source disposed within the terminal housing. A gas box, for example, is electrically coupled to the ion source, and a hydrogen generator is disposed within the gas box. The hydrogen generator, for example, is configured to produce hydrogen gas for the ion source, and is at the same electrical potential as the ion source.

In one example, the ion source and gas box are electrically isolated from the terminal housing via a plurality of electrical insulators. Further, a plurality of insulating standoffs are provided in another example to electrically isolate the terminal housing from an earth ground.

For example, a terminal power supply is provided and configured to electrically bias the terminal housing to a terminal potential, such as 300 keV with respect to the earth ground. In another example, an extraction power supply is provided and configured to electrically bias the gas box and ion source to a potential greater with respect to the terminal potential. The gas box and ion source potential, for example, is elevated approximately 60 keV with respect to the terminal potential.

In accordance with another example, electrically conductive tubing is provided to electrically couple the gas box to the ion source, wherein the electrically conductive tubing provides a fluid communication between the hydrogen generator and the ion source. The electrically conductive tubing, for example, comprises stainless steel tubing.

In accordance with another exemplary aspect, an ion implantation system is further disclosed. The ion implantation system comprises a terminal having a terminal housing, an ion source configured to form an ion beam, and a gas box. The gas box, for example, comprises a hydrogen generator configured to produce hydrogen gas for the ion source, wherein the gas box is electrically insulated from the terminal housing, and wherein the gas box is electrically coupled to the ion source. In one example, the ion implantation system further comprises a beamline assembly configured to selectively transport the ion beam, as well as an end station configured to accept the ion beam for implantation of ions into a workpiece.

The above summary is merely intended to give a brief overview of some features of some embodiments of the present disclosure, and other embodiments may comprise additional and/or different features than the ones mentioned above. In particular, this summary is not to be construed to be limiting the scope of the present application. Thus, to the accomplishment of the foregoing and related ends, the disclosure comprises the features hereinafter described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the disclosure when considered in conjunction with the drawings.

DETAILED DESCRIPTION

Figure 1:
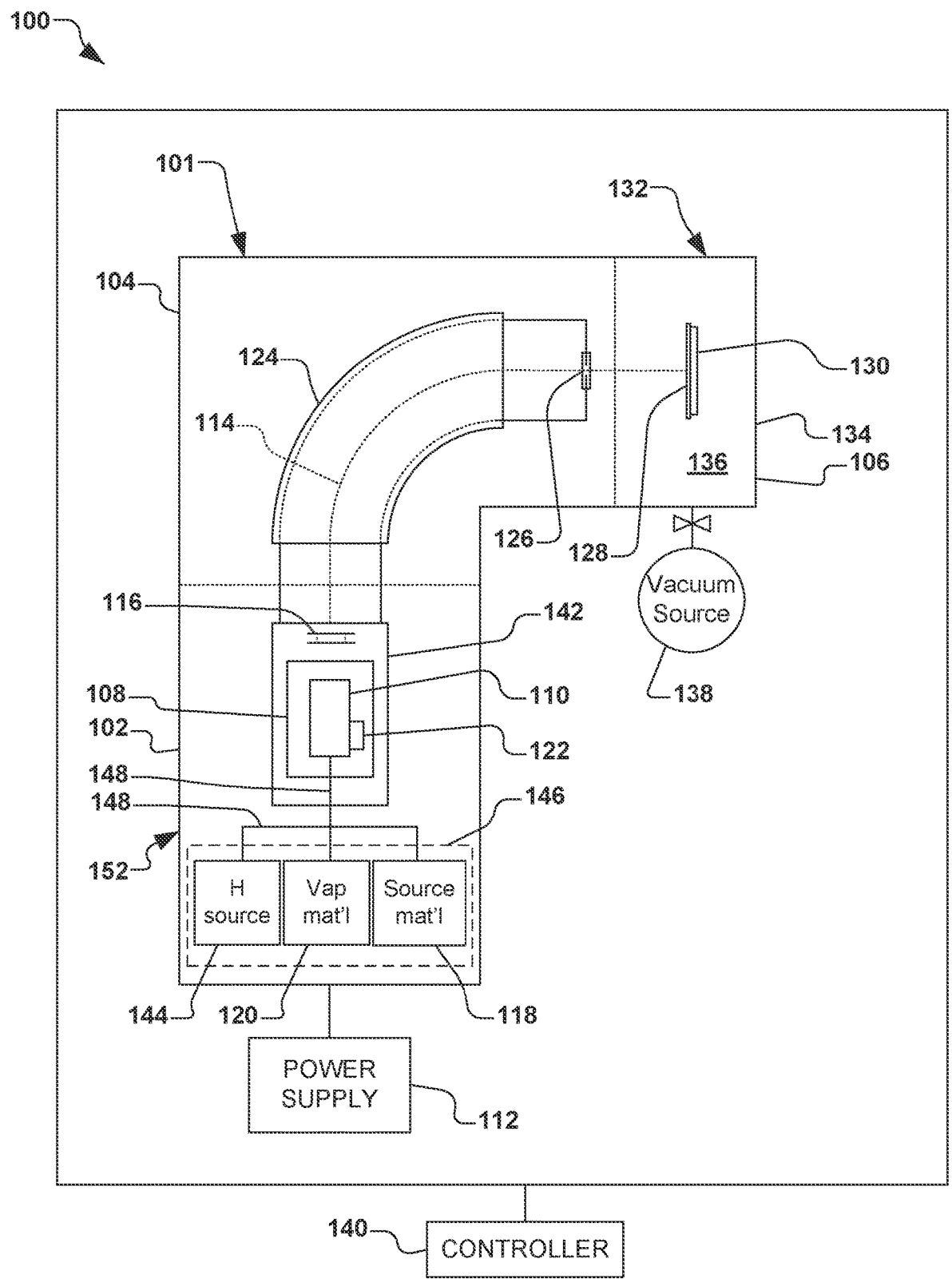
FIG. 1 is a block diagram of an exemplary vacuum system utilizing a hydrogen generator in accordance with several aspects of the present disclosure.

The present disclosure is directed generally toward an ion implantation system and a source for generating hydrogen gas associated therewith. More particularly, the present disclosure is directed toward hydrogen generation components for generating hydrogen for said ion implantation system. The present disclosure positions a hydrogen gas generator in a gas box associated with an ion source, whereby the gas box is maintained at an elevated voltage. Accordingly, containment and safety aspects of the gas box enclosure advantageously ameliorate duplicative hardware and gas delivery piping.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

In accordance with one aspect of the present disclosure, FIG. 1 illustrates an exemplary vacuum system 100. The vacuum system 100 in the present example comprises an ion implantation system 101, however various other types of vacuum systems are also contemplated, such as plasma processing systems, or other semiconductor processing systems. The ion implantation system 101, for example, comprises a terminal 102, a beamline assembly 104, and an end station 106.

Generally speaking, an ion source assembly 108 in the terminal 102 has an arc chamber 110 that is coupled to a power supply 112 to ionize a dopant gas into a plurality of ions to form an ion beam 114. An extraction electrode 116 may be biased to inhibit back streaming of electrons generated close to the ion source assembly 108 or downstream of the extraction electrode. An ion source material 118 of the present disclosure is provided to the arc chamber 110 in the ion source assembly 108, wherein the ion source material may comprise $BF_3$, $PF_3$, $NF_3$, or other material based on the desired ion implantation. In one example, a vaporizer material 120 such as aluminum(III) iodide ($AlI_3$) can be supplied to the arc chamber 110, or the vaporizer material can be installed in vaporizer 122 which is part of the source assembly 108 associated with the arc chamber, as will be discussed in further detail infra.

The ion beam 114 in the present example is directed through a beam-steering apparatus 124, and out an aperture 126 towards the end station 106. In the end station 106, the ion beam 114 bombards a workpiece 128 (e.g., a semiconductor such as a silicon wafer, a display panel, etc.), which is selectively clamped or mounted to a chuck 130 (e.g., an electrostatic chuck or ESC). Once embedded into the lattice of the workpiece 128, the implanted ions change the physical and/or chemical properties of the workpiece. Because of this, ion implantation is used in semiconductor device fabrication and in metal finishing, as well as various applications in materials science research.

The ion beam 114 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 132, such as a vacuum chamber 134, wherein a process environment 136 is associated with the process chamber. The process environment 136 generally exists within the process chamber 132, and in one example, comprises a vacuum produced by a vacuum source 138 (e.g., a vacuum pump) coupled to the process chamber and configured to substantially evacuate the process chamber. Further, a controller 140 is provided for overall control of the vacuum system 100.

The present disclosure appreciates that workpieces 128 having silicon carbide-based devices formed thereon have been found to have better thermal and electrical characteristics than silicon-based devices, in particular, in applications used in high voltage and high temperature devices, such as electric cars, etc. Ion implantation into silicon carbide, however, utilizes a different class of implant dopants than those used for silicon workpieces. In silicon carbide implants, aluminum and nitrogen implants are often performed. Nitrogen implants, for example, are relatively simple, as the nitrogen can be introduced as a gas, and provides relatively easy tuning, cleanup, etc. Aluminum, however, is more difficult, as there are presently few good gaseous solutions of aluminum known.

Materials such as aluminum nitride (AlN), alumina ($Al_2O_3$), etc. may be used as a source of aluminum ions for the purpose of ion implantation. Aluminum nitride or alumina are solid, insulative materials which are placed in the arc chamber where the plasma is formed (in the ion source). A gas may be introduced (e.g., fluorine) to chemically etch the aluminum-containing materials, whereby the material is ionized, and aluminum is extracted and transferred along the beamline to silicon carbide workpiece positioned in the end station. For example, the aluminum-containing materials are commonly used with some form of etchant gas (such as $BF_3$, $PF_3$, $NF_3$, etc.) in the arc chamber as the source of the aluminum ions. These materials have the unfortunate side effect of producing insulating material (e.g., AlN, $Al_2O_3$, etc.) which is emitted along with the intended ions from the arc chamber.

The insulating material can subsequently coat components such as extraction electrodes 116 associated with a source housing 142 of the ion source assembly 108, which then begin to charge up and unfavorably alter the electrostatic characteristic of these electrodes and build up charge on them. This results in behavior commonly referred to as glitching, or arcing, of these electrodes as the built up charge arcs to other components and or ground. In extreme cases, power supply behavior can be altered and distorted. This results in unpredictable beam behavior and leads to frequent preventive maintenance to clean these components and reduced beam currents. Additionally, flakes and other residue from these materials form in the arc chamber 110 as well as the source assembly 108 and source housing 142, thus altering its operational characteristics, leading to frequent cleaning.

In accordance with one aspect, the present disclosure contemplates using aluminum(III) iodide ($AlI_3$) to produce atomic aluminum ions, whereby the aforementioned insulating materials, flakes, etc., are not produced and do not build up, thus extending the lifetime of the source and electrodes, producing a more stable ion beam operation, and allowing substantially higher beam currents. Thus, the present disclosure produces single atom aluminum ions from aluminum(III) iodide ($AlI_3$) solid source material to electrically dope a silicon carbide, silicon, or other substrate, at temperatures from room temperature to 1000° C., with improved source lifetimes, beam currents, and operational characteristics than current techniques.

In another example, various ion implantation processes may utilize halogen-based dopant gases or compounds such as $BF_3$, $GeF_4$, $SiF_4$, and others. When these compounds are cracked in the arc chamber 110, the resulting fluorine byproducts can have a deleterious effect on the stability and lifetime of the ion source and overall beamline, as the fluorine byproducts are highly electronegative and readily react with various refractory metals, graphite and ceramic components which make up the ion source and extraction electrode assemblies.

When using aluminum(III) iodide ($AlI_3$) as a starting material (e.g., the vaporizer material 120 supplied the vaporizer 122) for the ion source assembly 108, the resulting byproduct (e.g., iodine) may coat various components within the source housing 142 with an insulating coating. The insulating coating, for example, may subsequently charge and discharge when in the proximity of a high voltage field. In both of these cases, the ion beam 114 may generally become so unstable that, over time, it may become necessary to remove components such as the ion source assembly 108 from a production environment for maintenance, cleaning, or replacement. In order to mitigate the negative effects of such dopant byproducts, a hydrogen co-gas may be introduced to the arc chamber 110, whereby the hydrogen co-gas reacts with fluorine forming HF or $H_2F$, thus eliminating the halogen cycle. For iodine, the hydrogen reaction will generally form a volatile gas that can be safely pumped out of the ion source.

For example, using Germanium tetrafluoride ($GeF_4$) with hydrogen as a co-gas in the ion source, the following reactions can occur:

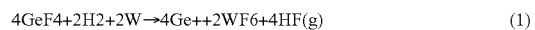

$$4GeF_4 + 2H_2 + 2W \rightarrow 4Ge+ + 2WF_6 + 4HF(g) \quad (1)$$

and

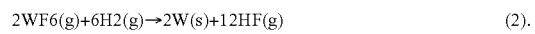

$$2WF_6(g) + 6H_2(g) \rightarrow 2W(s) + 12HF(g) \quad (2).$$

When $GeF_4$ is used without hydrogen as a co-gas, the following reactions can occur:

$$6GeF_4 + 4W \rightarrow 6Ge+ + 4WF_6 \quad (3)$$

and

$$4WF_6(g) \rightarrow 4W(s) + 24\ F\cdot(g) \quad (4).$$

The result of equation (4) is generally thermally unstable, and a decomposition back to elemental tungsten (W) and release F· back to the plasma may occur.

When aluminum(III) iodide $AlI_3$ is used with hydrogen as a cogas, the following reaction can occur:

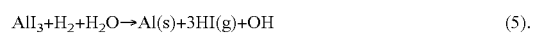

$$AlI_3 + H_2 + H_2O \rightarrow Al(s) + 3HI(g) + OH \quad (5).$$

The water ($H_2O$) in equation (5), for example, arises from moisture in the chamber well. The kinetics of the reaction from iodide and hydrogen, for example, is favorable because it reduces the overall energy after forming the volatile gas by-product (HI), which is continuously being pumped away as it forms.

Several methods of supplying or generating hydrogen gas for the ion source assembly 108 (e.g., supplied to the source housing 142) or arc chamber 110 may be possible. For example, a high-pressure bottle containing hydrogen may be used as a gas source, whereby the high-pressure bottle may be fluidly coupled to the ion source assembly 108. In such an instance, a small orifice is utilized at the output of the gas source to prevent large volumes of gas being released, in case of a major failure associated therewith. Another alternative example to supplying hydrogen gas for the ion source assembly 108 or arc chamber 110 may comprise a vacuum-activated bottle that serves as a Safe Delivery System (SDS) utilizing a low pressure bottle, whereby the gas delivery line to the ion source is under vacuum.

Still another alternative example to supplying hydrogen gas for the ion source assembly 108 or arc chamber 110 may comprise a hydrogen generator 144. For example, water can be dissociated using one or several electrolysis cells that are connected serially. Each electrolysis cell comprises an anode electrode (e.g., for oxygen production), a cathode electrode (e.g., for hydrogen production), and a diaphragm (e.g., for separation of oxygen and hydrogen). A reservoir, for example, may be configured to store only enough hydrogen that is needed for the process, thereby making the hydrogen generator 144 a safe alternative for applications where the presence of high pressure hydrogen bottles is a concern.

The present disclosure contemplates providing the hydrogen generator 144 in a gas box 146 associated with the terminal 102, whereby the gas box is at an extraction potential of the ion source assembly 108 (e.g., the gas box is at the same high potential or extraction voltage as the ion source), and whereby an output of the hydrogen generator can be plumbed directly into the ion source for use as co-gas using a conductive tubing 148 (e.g., a stainless steel tube). Thus, safety and containment features of the gas box 146 can be utilized, whereby concerns of bridging a high voltage gap with a non-conductive tubing can be avoided. For example, non-conductive tubing can be easily damaged, thus potentially releasing flammable hydrogen and/or a toxic dopant in a vicinity external to the ion source assembly 108. The gas box 146, for example, is an enclosure in the terminal 102 shown in FIG. 2, and is associated with the ion source assembly 108, whereby pressurized gas bottles containing various gasses associated with the implant are located. By positioning the hydrogen generator 144 in the gas box 146 (which in one example is already at an elevated voltage from ground), the containment and safety aspects of the gas box enclosure can be utilized, thus avoiding duplicate designs/hardware, including the gas delivery piping.

Conventionally, a gas box is maintained at an extraction potential (e.g., an elevated potential from ground potential) that may range from approximately 1 keV to 60 keV. Conventionally, when implementing a hydrogen generator (not shown) for production of a hydrogen co-gas for an ion source, the hydrogen generator is a stand-alone component that is placed on the floor at ground potential outside the terminal. At such a ground potential, the stand-alone hydrogen generator can be at an electrical potential that is significantly lower than the ion source. As such, non-conductive tubing such as polyethylene (e.g., Poly-Flo®) or Teflon® tubing has been utilized to cross a high-voltage gap between electrical ground and the terminal in order to transfer the gas into the gas box to connect to a flow controller to flow the hydrogen gas into the ion source, itself. However, it is presently appreciated that such use of non-conductive tubing to cross the high-voltage gap has various detrimental deficiencies, such as being a trip hazard, as well as having the potential of leaking potentially explosive hydrogen gas into the nearby environment.

Thus, in accordance with one exemplary aspect of the present disclosure, the hydrogen generator 144 is provided and sized to fit in a slot where a conventional gas bottle is normally placed in the gas box 146. As such, various safety features are provided, whereby the hydrogen gas may be injected into the ion source assembly 108 while being at the same electrical potential as the ion source assembly. The gas box 146, for example, rests on a plurality of electrical insulators 150, whereby the gas box and various controllers (not shown) for the ion source assembly 108 are at the same electrical potential as the ion source, while being electrically insulated from a terminal housing 152 of the terminal 102. Thus, by positioning the hydrogen generator 144 in the gas box 146, no voltage drop is present between the hydrogen generator and the ion source 108. Thus, fluid connections from the hydrogen generator 144 in the gas box 146 to the ion source 108 can advantageously comprise the conductive tubing 148, such as stainless steel tubing, whereby the conductive tubing provides a robust and safe fluid coupling therebetween.

The present disclosure advantageously provides hydrogen gas that is at an elevated voltage above a ground reference. As such, various containment apparatus and controls, etc. need not be duplicated to mitigate sparks associated with a low flow of a flammable gas. While a high-pressure hydrogen bottle may alternatively be placed in the gas box 146, such a positioning of a high-pressure bottle of flammable gas could lead to catastrophic failure due to dropping of the bottle or breakage of a shut off valve on bottle, thus leading to uncontrolled leakage of hydrogen. Furthermore, transportation into the building housing the ion implantation system may be problematic for various reasons, such as regulations governing the implementation of such high-pressure bottles.

The hydrogen generator 144 of the present disclosure, for example, may be configured to flow hydrogen gas at a rate of approximately 10 sccm. In one example, the hydrogen generator 144 has relatively small storage capacity of approximately 5 psi or less. As such, the hydrogen gas is not stored at high pressures (e.g., 2000 psi) that are typically associated with the high pressure gas bottles discussed above. Further, the hydrogen generator 144 is maintained at the same potential as the ion source 108 (e.g., an elevated voltage above electrical ground), which can be approximately 1 keV to 60 keV above ground potential.

Figure 2:
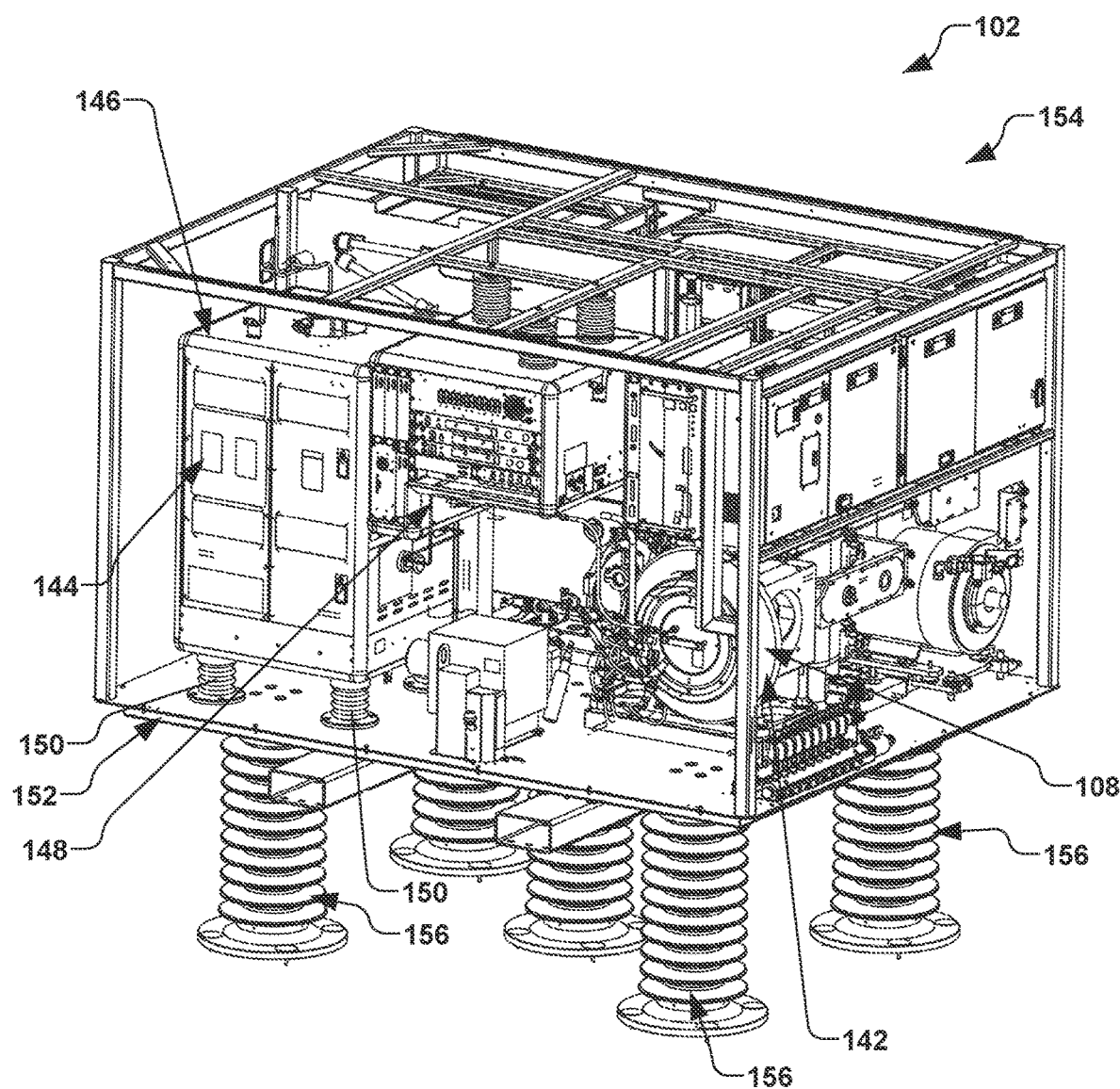
FIG. 2 illustrates a perspective view of an exemplary terminal comprising an ion source and gas box in accordance with another aspect of the present disclosure.
Figure 3:
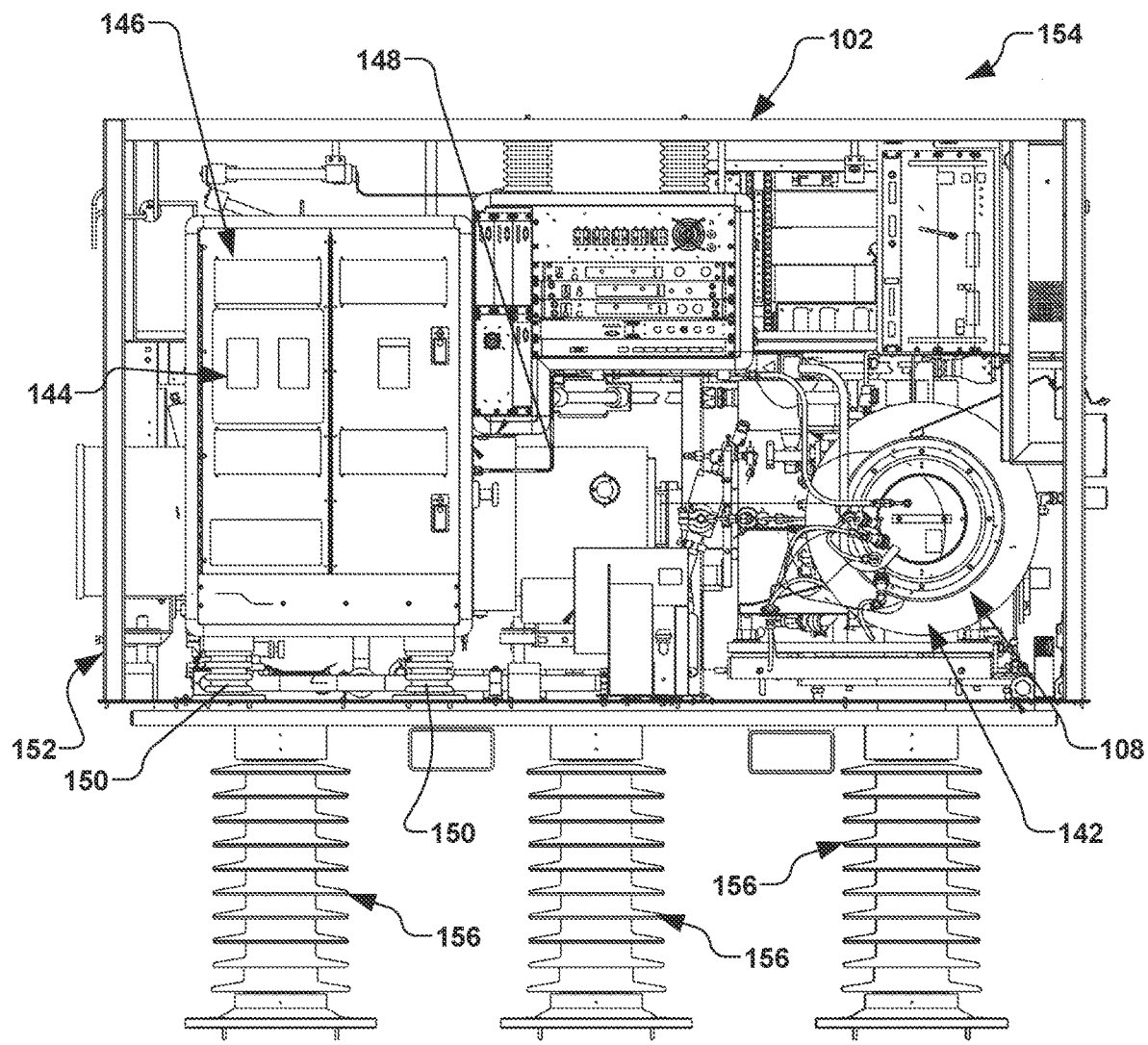
FIG. 3 illustrates a plan view of an exemplary terminal comprising an ion source and gas box in accordance with another aspect of the present disclosure.

Accordingly, the present disclosure provides a terminal system 154 shown in FIGS. 2-3 (e.g., the terminal 102 of FIG. 1) for the ion implantation system 101 comprising a hydrogen generator 144 that is at the same electrical potential as the ion source assembly 108. The terminal system 154, for example, may be electrically isolated from earth ground by a plurality of insulating standoffs 156, as illustrated in FIGS. 2-3. Since the terminal system 154 is electrically insulated from earth ground via the insulating standoffs 156, the terminal system can be considered a ground reference (e.g., a return reference), whereby the terminal system 154 can be biased to various voltages, such as approximately negative 300 keV. The gas box 146 and ion source assembly 108, for example, are coupled with the conductive tubing 148 discussed above, and are thus at the same potential as one another, whereby both the gas box and ion source can be at an elevated potential (e.g., 60 keV) above the terminal housing 152 while being further insulated from the earth ground by the plurality of insulating standoffs 156, thus providing the gas box and ion source at 360 keV above ground potential.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. A terminal system for an ion implantation system, wherein the terminal system comprises:
   a terminal housing;
   an ion source assembly disposed within the terminal housing, wherein the ion source assembly is electrically isolated from the terminal housing; and
   a hydrogen generator disposed within the terminal housing, wherein the hydrogen generator is at the same electrical potential as the ion source assembly and electrically coupled thereto, and wherein the hydrogen generator is configured to produce hydrogen gas and supply said hydrogen gas to the ion source assembly.

2. The terminal system of claim 1, further comprising a gas box, wherein the hydrogen generator is disposed within the gas box, and wherein the gas box is electrically coupled to the ion source assembly.

3. The terminal system of claim 2, further comprising one or more electrical insulators, wherein the one or more electrical insulators electrically isolate the ion source assembly and gas box from the terminal housing.

4. The terminal system of claim 1, further comprising one or more insulating standoffs, wherein the one or more insulating standoffs electrically isolate the terminal housing from an earth ground.

5. The terminal system of claim 4, further comprising a terminal power supply configured to electrically bias the terminal housing to a terminal potential with respect to the earth ground.

6. The terminal system of claim 5, wherein the terminal potential is approximately negative 300 keV with respect to the earth ground.

7. The terminal system of claim 5, further comprising an ion source power supply, wherein the ion source power supply is configured to electrically bias the ion source assembly to an ion source potential with respect to the terminal potential.

8. The terminal system of claim 7, wherein the ion source potential is elevated approximately 60 keV with respect to the terminal potential.

9. The terminal system of claim 1, further comprising a conductive tube electrically coupling the hydrogen generator to the ion source assembly.

10. The terminal system of claim 9, wherein the conductive tube provides a fluid communication between the hydrogen generator and the ion source assembly, and wherein the hydrogen generator is configured to supply the hydrogen gas to the ion source assembly via the conductive tube.

11. The terminal system of claim 9, wherein the conductive tube comprises stainless steel tubing.

12. An ion implantation system, comprising:
   an ion source configured to form an ion beam;
   a hydrogen generator configured to produce hydrogen gas and supply said hydrogen gas to the ion source, wherein the hydrogen generator is at the same electrical potential as the ion source and electrically coupled thereto;
   a beamline assembly configured to selectively transport the ion beam; and
   an end station configured to accept the ion beam for implantation of ions into a workpiece.

13. The ion implantation system of claim 12, further comprising a terminal housing, wherein the ion source and hydrogen generator are disposed within the terminal housing.

14. The ion implantation system of claim 13, further comprising a gas box, wherein the hydrogen generator is disposed within the gas box, and wherein the gas box is electrically coupled to the ion source.

15. The ion implantation system of claim 14, further comprising one or more electrical insulators, wherein the one or more electrical insulators electrically isolate the ion source and gas box from the terminal housing.

16. The ion implantation system of claim 13, further comprising:
   a terminal power supply configured to electrically bias the terminal housing to a terminal potential with respect to an earth ground; and
   one or more insulating standoffs, wherein the one or more insulating standoffs electrically isolate the terminal housing from the earth ground.

17. The ion implantation system of claim 16, further comprising an ion source power supply, wherein the ion source power supply is configured to electrically bias the ion source to an ion source potential with respect to the terminal potential.

18. The ion implantation system of claim 12, further comprising a conductive tube electrically coupling the hydrogen generator to the ion source, wherein the conductive tube provides a fluid communication between the hydrogen generator and the ion source, and wherein the hydrogen generator is configured to supply the hydrogen gas to the ion source via the conductive tube.

19. A terminal system for an ion implantation system, wherein the terminal system comprises:
   a terminal housing;
   an ion source assembly disposed within the terminal housing;
   a hydrogen generator disposed within the terminal housing, wherein the hydrogen generator is at the same electrical potential as the ion source assembly and electrically coupled thereto, and wherein the hydrogen generator is configured to produce hydrogen gas and supply said hydrogen gas to the ion source assembly;
   one or more electrical insulators configured to electrically isolate the ion source assembly and hydrogen generator from the terminal housing; and
   one or more insulating standoffs, wherein the one or more insulating standoffs electrically isolate the terminal housing from an earth ground.

20. The terminal system of claim 19, further comprising:
a terminal power supply configured to electrically bias the terminal housing to a terminal potential with respect to the earth ground; and
an ion source power supply configured to electrically bias the ion source assembly to an ion source potential with respect to the terminal potential.

* * * * *